(12) United States Patent
Inoue

(10) Patent No.: US 6,787,417 B2
(45) Date of Patent: Sep. 7, 2004

(54) METHOD OF FABRICATING SEMICONDUCTOR DEVICE

(75) Inventor: Susumu Inoue, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 10/614,985

(22) Filed: Jul. 9, 2003

(65) Prior Publication Data

US 2004/0077145 A1 Apr. 22, 2004

(30) Foreign Application Priority Data

Jul. 12, 2002 (JP) .................................... 2002-204274

(51) Int. Cl.$^7$ .......................................... H01L 21/8247
(52) U.S. Cl. .................................... 438/258; 438/267
(58) Field of Search ............................... 438/201, 211, 438/258, 266, 267, 595, 596, 954

(56) References Cited

U.S. PATENT DOCUMENTS

| | | | |
|---|---|---|---|
| 5,408,115 A | 4/1995 | Chang | 257/324 |
| 5,422,504 A | 6/1995 | Chang et al. | 257/321 |
| 5,494,838 A | 2/1996 | Chang et al. | 438/267 |
| 5,969,383 A | 10/1999 | Chang et al. | 257/316 |
| 6,133,098 A * | 10/2000 | Ogura et al. | 438/267 |
| 6,177,318 B1 | 1/2001 | Ogura et al. | 438/258 |
| 6,248,633 B1 | 6/2001 | Ogura et al. | 438/267 |
| 6,255,166 B1 | 7/2001 | Ogura et al. | 438/257 |
| 6,395,596 B1 * | 5/2002 | Chien et al. | 438/258 |
| 6,413,821 B1 | 7/2002 | Ebina et al. | 438/258 |
| 6,518,124 B1 | 2/2003 | Ebina et al. | 438/258 |
| 6,531,350 B2 * | 3/2003 | Satoh et al. | 438/954 |

FOREIGN PATENT DOCUMENTS

| JP | A 7-161851 | 6/1995 |
|---|---|---|
| JP | B1 2978477 | 9/1999 |
| JP | A 2001-156188 | 6/2001 |

OTHER PUBLICATIONS

U.S. patent application Ser. No. 10/636,582, Inoue, filed Aug. 8, 2003.
U.S. patent application Ser. No. 10/636,562, Inoue, filed Aug. 8, 2003.
U.S. patent application Ser. No. 10/689,990, Kasuya, filed Oct. 22, 2003.
U.S. patent application Ser. No. 10/636,581, Yamamukai, filed Aug. 8, 2003.
U.S. patent application Ser. No. 10/690,025, Kasuya, filed Oct. 22, 2003.
U.S. patent application Ser. No. 10/689,993, Kasuya, filed Oct. 22, 2003.
U.S. patent application Ser. No. 10/689,987, Kasuya, filed Oct. 22, 2003.
U.S. patent application Ser. No. 10/244,627, Ebina et al., filed Sep. 17, 2002.

(List continued on next page.)

*Primary Examiner*—Chandra Chaudhari
(74) *Attorney, Agent, or Firm*—Oliff & Berridge, PLC

(57) ABSTRACT

A method of fabricating a semiconductor device in accordance with the present invention relates to a method of fabricating a semiconductor device including a memory region and a logic circuit region having a peripheral circuit, the method including the steps of: patterning a predetermined region formed of a stopper layer and a first conductive layer within the memory region, without patterning the logic circuit region; forming control gates in the form of side walls over both side surfaces of the first conductive layer within at least the memory region, with an ONO film interposed in between; forming first side wall dielectric layers on upper portions of the control gates; forming a gate electrode for a MOS transistor by patterning the first conductive layer within the logic circuit region; and forming a second side wall dielectric layer over the gate electrode and the side surfaces of the control gates and the first side wall dielectric layers.

4 Claims, 18 Drawing Sheets

OTHER PUBLICATIONS

U.S. patent application Ser. No. 10/234,197, Ebina et al., filed Sep. 5, 2002.

U.S. patent application Ser. No. 10/339,555, Shibata, filed Jan. 10, 2003.

U.S. patent application Ser. No. 10/350,010, Kasuya, filed Jan. 24, 2003.

U.S. patent application Ser. No. 10/349,943, Kasuya, filed Jan. 24, 2003.

U.S. patent application Ser. No. 10/234,095, Ebina et al., filed Sep. 5, 2002.

U.S. patent application Ser. No. 10/052,255, Ebina et al., filed Jan. 23, 2003.

U.S. patent application Ser. No. 10/052,549, Ebina et al., filed Jan. 23, 2002.

U.S. patent application Ser. No. 10/244,623, Ebina et al., filed Sep. 17, 2002.

U.S. patent application Ser. No. 10/350,075, Kasuya, filed Jan. 24, 2003.

U.S. patent application Ser. No. 10/342,307, Ueda, filed Jan. 15, 2003.

U.S. patent application Ser. No. 10/349,958, Kasuya, filed Jan. 24, 2003.

U.S. patent application Ser. No. 10/339,558, Inoue, filed Jan. 10, 2003.

Hayashi et al., "Twin MONOS Cell with Dual Control Gates," IEEE Symposium on VLSI Technology Digest of Technical Papers, 2000.

Chang et al., "A New SONOS Memory Using Source–Side Injection for Programming," IEEE Electron Device Letters, vol. 19, No. 7, pp. 253–255, Jul. 1998.

Chen et al., "A Novel Flash Memory Device with S Plit Gate Source Side Injection and ONO Charge Storage Stack (SPIN)," Symposium on VLSI Technology Digest of Technical Papers, pp. 63–64, 1997.

\* cited by examiner

# METHOD OF FABRICATING SEMICONDUCTOR DEVICE

Japanese Patent Application No. 2002-204274, filed on Jul. 12, 2002, is hereby incorporated by reference in its entirety.

BACKGROUND OF THE INVENTION

The present invention relates to a method of fabricating a semiconductor device that comprises a memory region and a logic circuit, and, more particularly, to a method of fabricating a semiconductor device wherein a non-volatile storage device formed in the memory region has two charge accumulation regions for one word gate.

One type of non-volatile semiconductor storage device is called a metal-oxide-nitride-oxide semiconductor (MONOS) type or silicon-oxide-nitride-oxide-silicon (SONOS) type, wherein a gate dielectric layer between a channel region and a control gate is formed of a multi-layer stack of silicon oxide and silicon nitride layers, and charge is trapped in the silicon nitride layer.

A device shown in FIG. 18 is known as an example of this MONOS type of non-volatile semiconductor storage device (disclosed by Y. Hayashi, et al, in 2000 Symposium on VLSI Technology Digest of Technical Papers, pp. 122–123).

In this MONOS memory cell 100, a word gate 14 is formed over a semiconductor substrate 10 with a first gate dielectric layer 12 interposed in between. A first control gate 20 and a second control gate 30 are formed on either side of the word gate 14, in the shape of side walls. There is a second gate dielectric layer 22 between a base portion of the first control gate 20 and the semiconductor substrate 10, and a dielectric layer 24 between a side surface of the first control gate 20 and the word gate 14. In a similar manner, the second gate dielectric layer 22 is between a base portion of the second control gate 30 and the semiconductor substrate 10, and the 24 is between a side surface of the second control gate 30 and the word gate 14. Impurity layers 16 and 18, which are to form a source region and drain region, are formed in the semiconductor substrate 10 between the opposing control gates 20 and 30 of neighboring memory cells.

In this manner, each memory cell 100 has two MONOS memory elements on the side surfaces of the word gate 14. These two MONOS memory elements can be controlled independently, and thus one memory cell 100 can store two bits of information.

BRIEF SUMMARY OF THE INVENTION

The present invention may provide a method of fabricating a semiconductor device that comprises a MONOS type of non-volatile storage device having two charge accumulation regions, wherein a memory region comprising a MONOS type of memory cell and a logic circuit region comprising a peripheral circuit for the memory are formed on the same substrate.

According to the present invention, there is provided a method of fabricating a semiconductor device that comprises a memory region including a non-volatile storage device and a logic circuit region including a peripheral circuit for the non-volatile storage device, the method comprising steps of:

(a) forming a first dielectric layer over a semiconductor layer,
(b) forming a first conductive layer over the first dielectric layer,
(c) forming a stopper layer over the first conductive layer,
(d) patterning the stopper layer and the first conductive layer within the memory region,
(e) forming a charge accumulation film over the memory region and the logic circuit region,
(f) forming a second conductive layer over the charge accumulation film, then forming control gates in the form of side walls over both side surfaces of the first conductive layer within at least the memory region with the charge accumulation film interposed in between, by anisotropic etching of the second conductive layer,
(g) forming first side wall dielectric layers on at least upper portions of the control gates and over both side surfaces of a laminate formed of the stopper layer and the first conductive layer,
(h) removing the stopper layer from within the logic circuit region,
(i) patterning the first conductive layer within the logic circuit region, to form a gate electrode of an insulated-gate field-effect transistor within the logic circuit region,
(j) forming side wall dielectric layers on both side surfaces of the gate electrode, and also forming a second side wall dielectric layer so as to cover each of the first side wall dielectric layers and each of the control gates,
(k) forming first impurity layers, each of which becomes a source region or a drain region of the non-volatile storage device and forming second impurity layers, each of which becomes a source region or a drain region of the insulated-gate field-effect transistor,
(l) forming silicide layers on the surfaces of the first impurity layers and the second impurity layers,
(m) forming a second dielectric layer over the memory region and the logic circuit region,
(n) removing the second dielectric layer in such a manner that the stopper layer is exposed within the memory region and also the gate electrode is not exposed within the logic circuit region,
(o) removing the stopper layer from within the memory region, and
(p) patterning the first conductive layer within the memory region, to form a word gate for the non-volatile storage device within the memory region.

DETAILED DESCRIPTION OF THE EMBODIMENT

Figure 1:
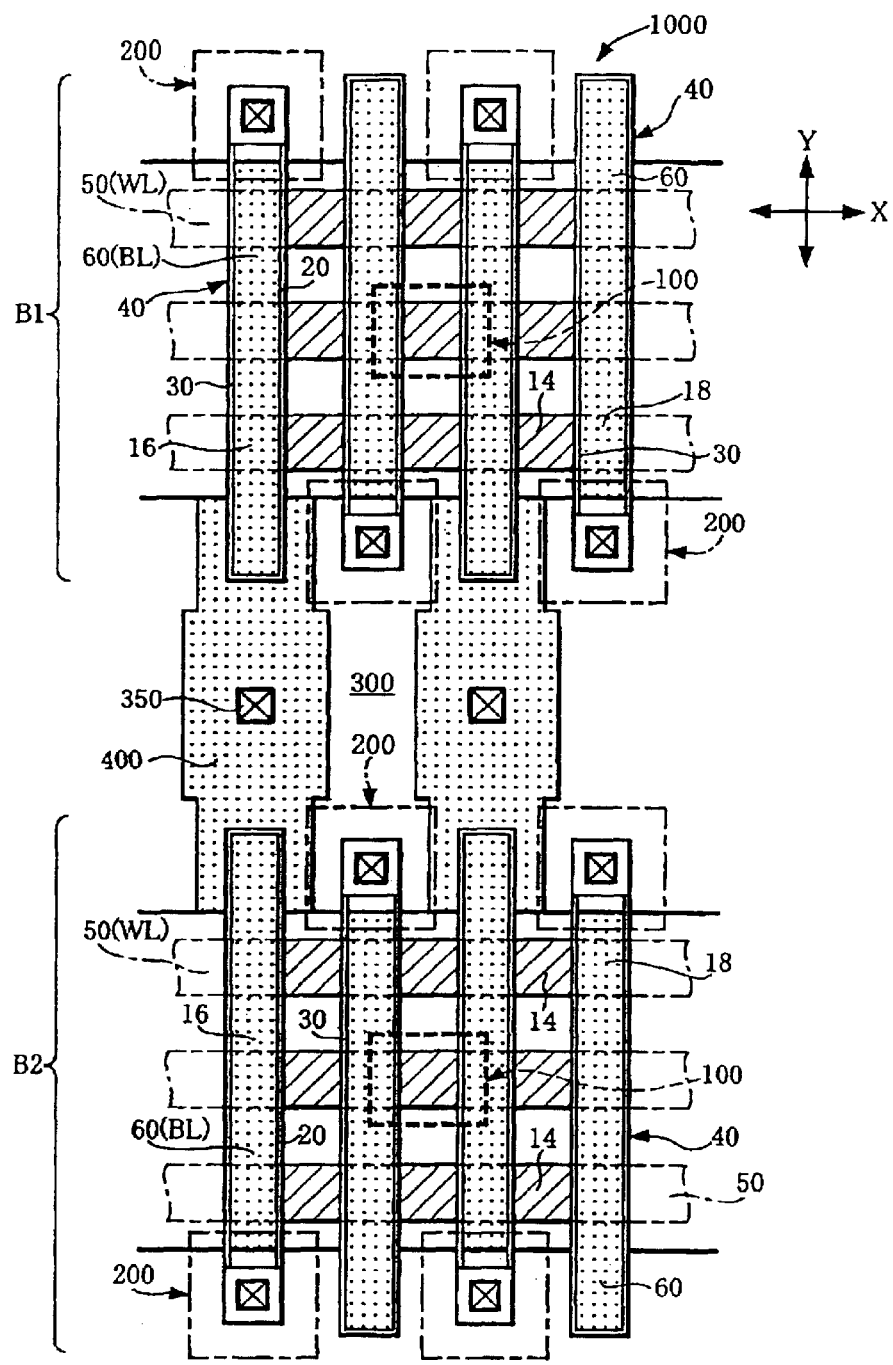
FIG. 1 is a schematic plan view of the layout of a semiconductor device.

According to one embodiment of the present invention, there is provided a method of fabricating a semiconductor device that comprises a memory region including a non-volatile storage device and a logic circuit region including a peripheral circuit for the non-volatile storage device, the method comprising steps of:

(a) forming a first dielectric layer over a semiconductor layer, (b) forming a first conductive layer over the first dielectric layer, (c) forming a stopper layer over the first conductive layer, (d) patterning the stopper layer and the first conductive layer within the memory region, (e) forming a charge accumulation film over the memory region and the logic circuit region, (f) forming a second conductive layer over the charge accumulation film, then forming control gates in the form of side walls over both side surfaces of the first conductive layer within at least the memory region with the charge accumulation film interposed in between, by anisotropic etching of the second conductive layer, (g) forming first side wall dielectric layers on at least upper portions of the control gates and over both side surfaces of a laminate formed of the stopper layer and the first conductive layer, (h) removing the stopper layer from within the logic circuit region, (i) patterning the first conductive layer within the logic circuit region, to form a gate electrode of an insulated-gate field-effect transistor within the logic circuit region, (j) forming side wall dielectric layers on both side surfaces of the gate electrode, and also forming a second side wall dielectric layer so as to cover each of the first side wall dielectric layers and each of the control gates, (k) forming first impurity layers, each of which becomes a source region or a drain region of the non-volatile storage device and forming second impurity layers, each of which becomes a source region or a drain region of the insulated-gate field-effect transistor, (l) forming silicide layers on the surfaces of the first impurity layers and the second impurity layers, (m) forming a second dielectric layer over the memory region and the logic circuit region, (n) removing the second dielectric layer in such a manner that the stopper layer is exposed within the memory region and also the gate electrode is not exposed within the logic circuit region, (o) removing the stopper layer from within the memory region, and (p) patterning the first conductive layer within the memory region, to form a word gate for the non-volatile storage device within the memory region.

In the method of fabricating a semiconductor device according to this embodiment, since first side wall dielectric layers are formed over the side surfaces of the laminate formed of the gate electrode and the stopper layer so as to cover upper portions of the control gates, it is possible to minimize discontinuities in the surfaces on which the second side wall dielectric layers are formed in subsequent processing, and thus form the second side wall dielectric layers in a satisfactory manner. In other words, each of the first side wall dielectric layers and each of the second side wall dielectric layers can form a dielectric layer that completely covers each of the control gates. This therefore makes it possible to avoid the problem of short-circuiting between the control gates and an interconnecting line disposed thereabove.

(A) With the method of fabricating a semiconductor device in accordance with this embodiment, the step (l) may comprise forming a silicide layer on the surface of the gate electrode.

(B) With the method of fabricating a semiconductor device in accordance with this embodiment, in the step (n), the second dielectric layer may be removed by polishing.

(C) With the method of fabricating a semiconductor device in accordance with this embodiment, an ONO film may be used as the charge accumulation film.

Figure 2:
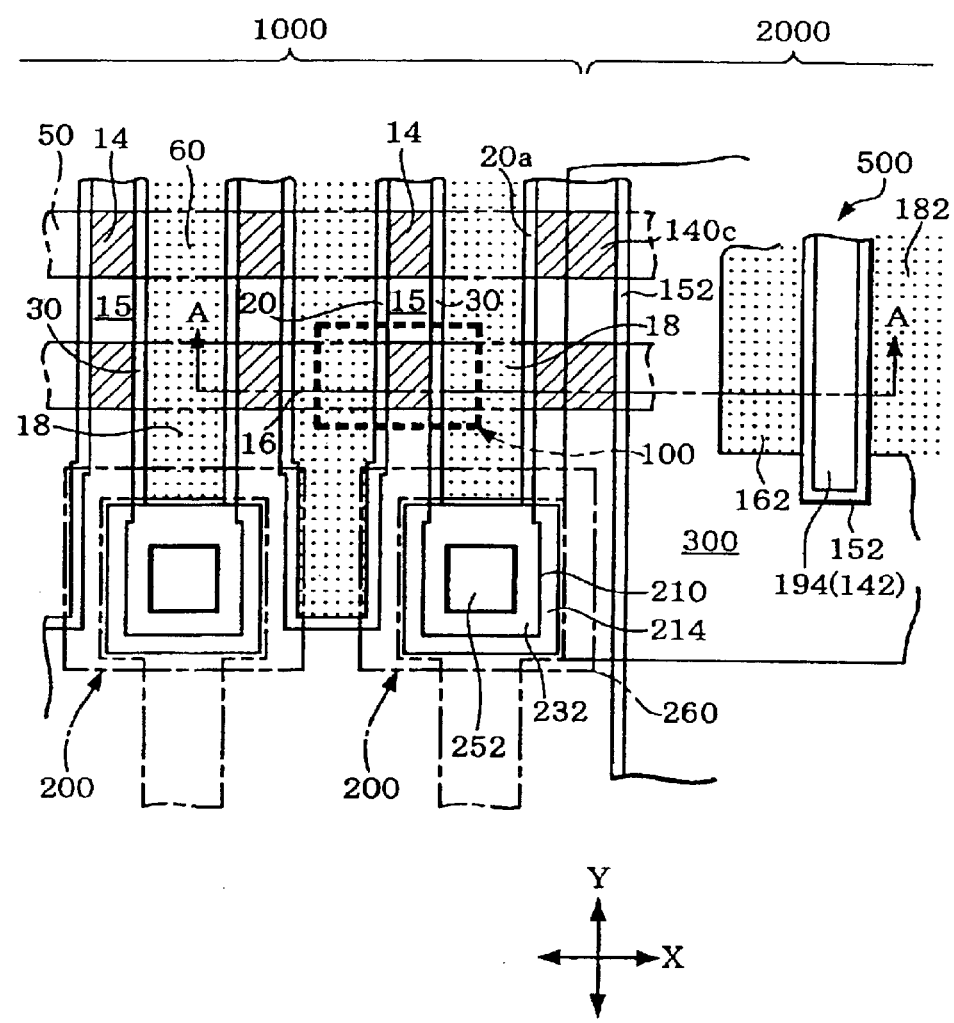
FIG. 2 is a schematic plan view of essential portions of the semiconductor device.
Figure 3:
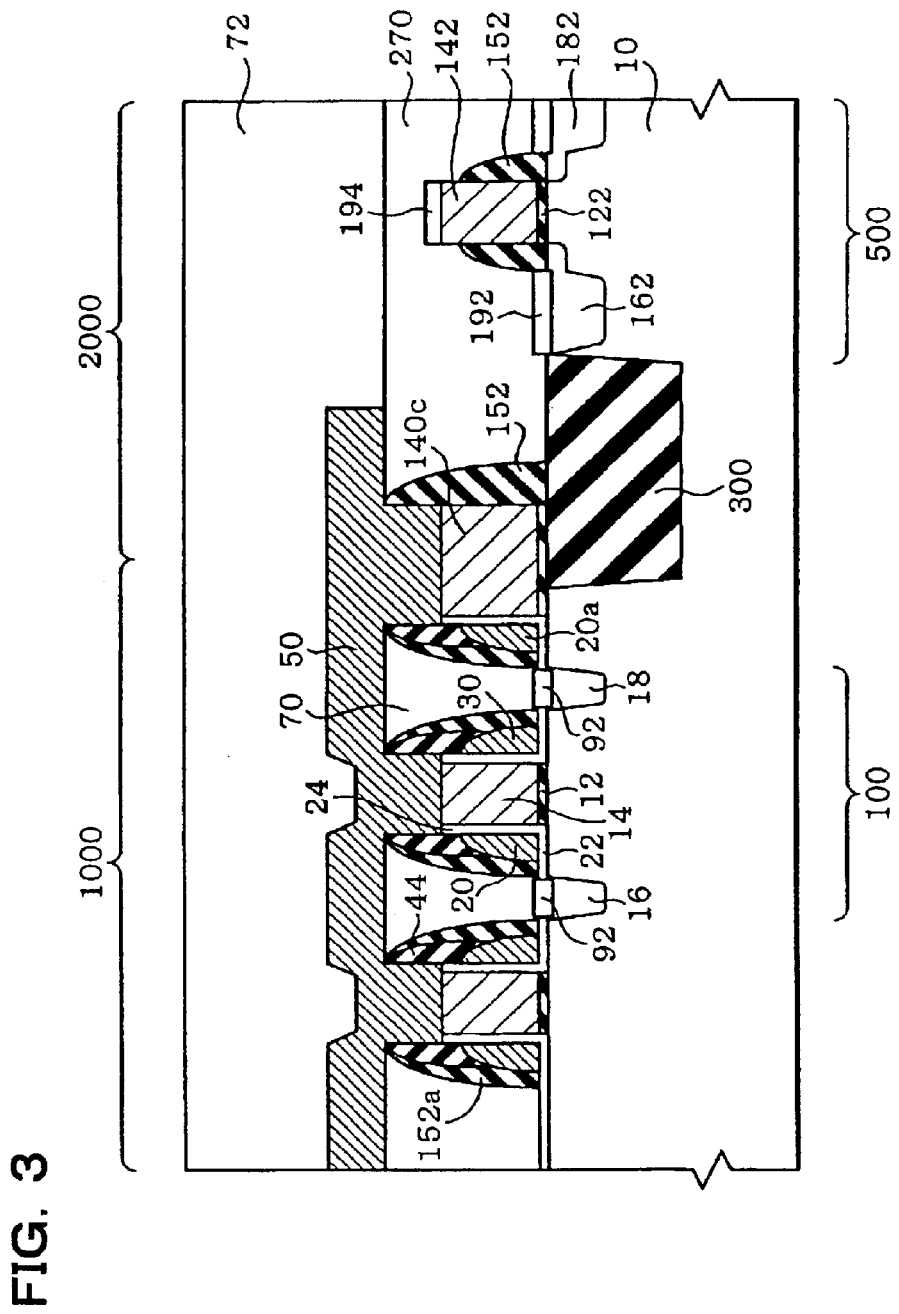
FIG. 3 is a schematic section view taken along the line A—A in FIG. 2.

The method of fabricating a semiconductor device in accordance with this embodiment is described below with reference to the accompanying figures. A plan view of the layout of the memory region of a semiconductor device obtained by the fabrication method of this embodiment is shown in FIG. 1. A plan view of part of the semiconductor device in accordance with this embodiment is shown in FIG. 2. A section view taken along the line A—A of FIG. 2 is shown in FIG. 3.

The semiconductor device shown in FIGS. 1 to 3 comprises a memory region 1000, which is configured of a plurality of MONOS type non-volatile storage devices (hereinafter called "memory cells") 100 disposed in a lattice array of a plurality of rows and columns, and a common contact portion 200 comprising a peripheral circuit for the memory.

1. Device Configuration

The description first concerns the layout of the memory region 1000, with reference to FIG. 1.

FIG. 1 shows a first block B1 that is part of the memory region 1000 and a second block B2 adjacent thereto.

An element isolation region 300 is formed in a partial region between the first block B1 and the second block B2. Each of the blocks B1 and B2 is provided with a plurality of word lines 50 (WL) extending in an X direction (row direction) and a plurality of bit lines 60 (BL) extending in a Y direction (column direction). Each word line 50 is connected to a plurality of word gates 14 disposed in the X direction. Each bit line 60 is configured of impurity layers 16 and 18.

A conductive layer 40 that forms the first and second control gates 20 and 30 is formed so as to surround each of the impurity layers 16 and 18. In other words, the first and second control gates 20 and 30 each extend in the Y direction and the portions at one end of the pair of first and second control gates 20 and 30 are connected together by the conductive layer extending in the X direction. The other end portions of each pair of the first and second control gates 20 and 30 are connected to one common contact portion 200. Thus, the first and second control gates 20 and 30 function as a control gate for a memory cell and as an interconnecting line that connects the control games that are arrayed in the Y direction.

A single memory cell 100 comprises one word gate 14, the first and second control gates 20 and 30 formed on either side of that word gate 14, and the impurity layers 16 and 18 that are formed within the semiconductor substrate on the outer sides of those first and second control gates 20 and 30. The impurity layers 16 and 18 are owned in common by adjacent memory cells 100.

The impurity layer 16 formed in block B1 and the impurity layer 16 formed in block B2, which are impurity layers 16 that are mutually adjacent in the Y direction, are electrically connected together by a contact impurity layer 400. This contact impurity layer 400 is formed on the opposite side of the impurity layer 16 from the common contact portion 200 of the control gate.

A contact 350 is formed on top of this contact impurity layer 400. The bit line 60 formed by the impurity layer 16 is connected electrically to a interconnect layer above it by this contact 350.

Similarly, two impurity layers 18 are mutually adjacent in the Y direction are electrically connected by the contact impurity layer 400 on the sides on which the common contact portions 200 are not provided.

As can be seen from FIG. 1, the layout in plan of a plurality of the common contact portions 200 in one block is formed on alternating sides of the impurity layers 16 and the impurity layers 18, forming a zigzag arrangement.

The description now turns to the configurations of the semiconductor device in plan and in section, with reference to FIGS. 2 and 3. The common contact portion 200 that forms a peripheral circuit for the memory, by way of example, is formed in a position adjacent to the memory region 1000. The memory region 1000 and the logic circuit region 2000 are separated electrically by the element isolation region 300. The memory region 1000 is configured of at least the memory cell 100. Within the logic circuit region 2000 is formed at least an insulated-gate field-effect transistor (hereinafter called "MOS transistor") 500 that forms a logic circuit.

The description first concerns the memory region 1000.

The memory cell 100 comprises the word gate 14 formed over the semiconductor substrate 10 with the first gate dielectric layer 12 interposed in between, the impurity layers 16 and 18 formed in the semiconductor substrate 10 to form the source region or drain region, and the first and second control gates 20 and 30 formed in the shape of side walls along both sides of the word gate 14. A silicide layer 92 is formed over the impurity layers 16 and 18.

The first control gate 20 is formed over the semiconductor substrate 10 with a second gate dielectric layer (charge accumulation film) 22 interposed in between, and also over one side surface of the word gate 14 with a side dielectric layer 24 interposed in between. Similarly, the second control gate 30 is formed over the semiconductor substrate 10 with a second gate dielectric layer 22 interposed in between, and also over the other side surface of the word gate 14 with the side dielectric layer 24 interposed in between.

The second gate dielectric layer 22 and the side dielectric layer 24 are ONO films. More specifically, the second gate dielectric layer 22 and the side dielectric layer 24 are a stack of a bottom silicon oxide layer (first silicon oxide layer), a silicon nitride layer, and a top silicon oxide layer (second silicon oxide layer).

The first silicon oxide layer of the second gate dielectric layer 22 forms a potential barrier between the channel region and the charge accumulation region. The silicon nitride layer of the second gate dielectric layer 22 functions as a first silicon oxide layer that traps carriers (such as electrons). The second silicon oxide layer of the second gate dielectric layer 22 forms a potential barrier between the control gate and the charge accumulation region.

The side dielectric layer 24 is separated electrically from each of the first and second control gates 20 and 30. The upper edge of the side dielectric layer 24 is positioned higher above the semiconductor substrate 10 than the upper edges of the first and second control gates 20 and 30, to prevent short-circuiting between the word gate 14 and the first and second control gates 20 and 30.

The side dielectric layer 24 and the second gate dielectric layer 22 are formed by the same film-formation step and the stack configurations thereof are equal.

An embedded dielectric layer 70 is formed between the neighboring first control gate 20 and second control gate 30 of adjacent memory cells 100. This embedded dielectric layer 70 covers them in such a manner that at least the first and second control gates 20 and 30 are not exposed. More specifically, the upper surface of the embedded dielectric layer 70 is positioned higher from the semiconductor substrate 10 than the upper edge of the side dielectric layer 24. Forming the embedded dielectric layer 70 in this manner makes it possible to achieve a more reliable electrical separation between the first and second control gates 20 and 30 and the word gate 14 and the word line 50.

A first side wall dielectric layer 44 is formed so as to cover the upper portions of the first and second control gates 20 and 30. In addition, a second side wall dielectric layer 152*a* is formed so as to cover the first side wall dielectric layer 44 and the first and second control gates 20 and 30. The second the side wall dielectric layer 152*a* is formed in the same step as a side wall dielectric layer 152 of the logic circuit region 2000.

A conductive layer for providing a predetermined potential to the first and second control gates 20 and 30 is formed on the common contact portion 200. The common contact portion 200 is formed from a first contact conductive layer 214, a first contact dielectric layer (not shown in the figures) positioned below the first contact conductive layer 214, a second contact dielectric layer 210, a second contact conductive layer 232, a third contact dielectric layer 252, and a third contact conductive layer 260, as shown in FIG. 2.

The second contact dielectric layer 210 is formed of a stack of a first silicon oxide layer, a silicon nitride layer, and a second silicon oxide layer. The first contact conductive layer 214 is formed on the outer side of the second contact dielectric layer 210. The second contact conductive layer 232 is formed on the inner side of the second contact dielectric layer 210. The second contact conductive layer 232 is formed of the same material as the first and second control gates 20 and 30. The third contact dielectric layer 252 is formed on the inner side of the second contact conductive layer 232. The third contact conductive layer 260 is connected to the first contact conductive layer 214 and the second contact conductive layer 232.

The description now turns to the logic circuit region 2000.

In the logic circuit region 2000 is formed a MOS transistor 500. The MOS transistor 500 comprises a gate electrode 142 formed over the semiconductor substrate 10 with a third gate dielectric layer 122 interposed in between, impurity layers 162 and 182 that form a source region or drain region formed within the semiconductor substrate 10, and the side wall dielectric layer 152 formed along both side surfaces of the gate electrode 142. A silicide layer 192 is formed on the upper surfaces of the impurity layers 162 and 182, and a silicide layer 194 is formed on the upper surface of the gate electrode 142.

The MOS transistor 500 is covered by a dielectric layer 270. This dielectric layer 270 is formed by the same step as the embedded dielectric layer 70.

The boundary portion 140c is formed in the boundary region between the memory region 1000 and the logic circuit region 2000, of the same material as the word gate 14 and the gate electrode 142, as shown in FIGS. 2 and 3. This boundary portion 140c is formed by the same film-formation step as the word gate 14 and the gate electrode 142. At least part of the boundary portion 140c is formed over the element isolation region 300.

A conductive layer 20a in the form of a side wall is formed on one side surface (on the memory region 1000 side) of the boundary portion 140c, of the same material as the first and second control gates 20 and 30. This side-wall-shaped conductive layer 20a extends in the Y direction and is electrically connected to the adjacent second control gate 30 by the common contact portion 200. This side-wall-shaped conductive layer 20a is not used as a control gate for the memory cell. However, the electrical characteristics of the second control gate 30 adjacent to the side-wall-shaped conductive layer 20a can be made equal to those of the other control gate by providing an electrical connection between the side-wall-shaped conductive layer 20a and the adjacent second control gate 30.

A side wall dielectric layer 152 that is formed by the same step as the side wall dielectric layer 152 of the MOS transistor 500 is formed on the other side surface of the boundary portion 140c (on the logic circuit region 2000 side).

An interlayer dielectric 72 is formed over the semiconductor substrate 10 on which is formed the memory cell 100, the MOS transistor 500, and the other components.

2. Method of Fabricating Semiconductor Device

The description now turns to a method of fabricating the semiconductor device in accordance with this embodiment, with reference to FIGS. 4 to 17. Each section corresponds to the portion taken along the line A—A of FIG. 2. In FIGS. 4 to 17, the same reference numbers are used to denote substantially the same portions as those shown in FIGS. 1 to 3, and redundant description is omitted.

Figure 4:
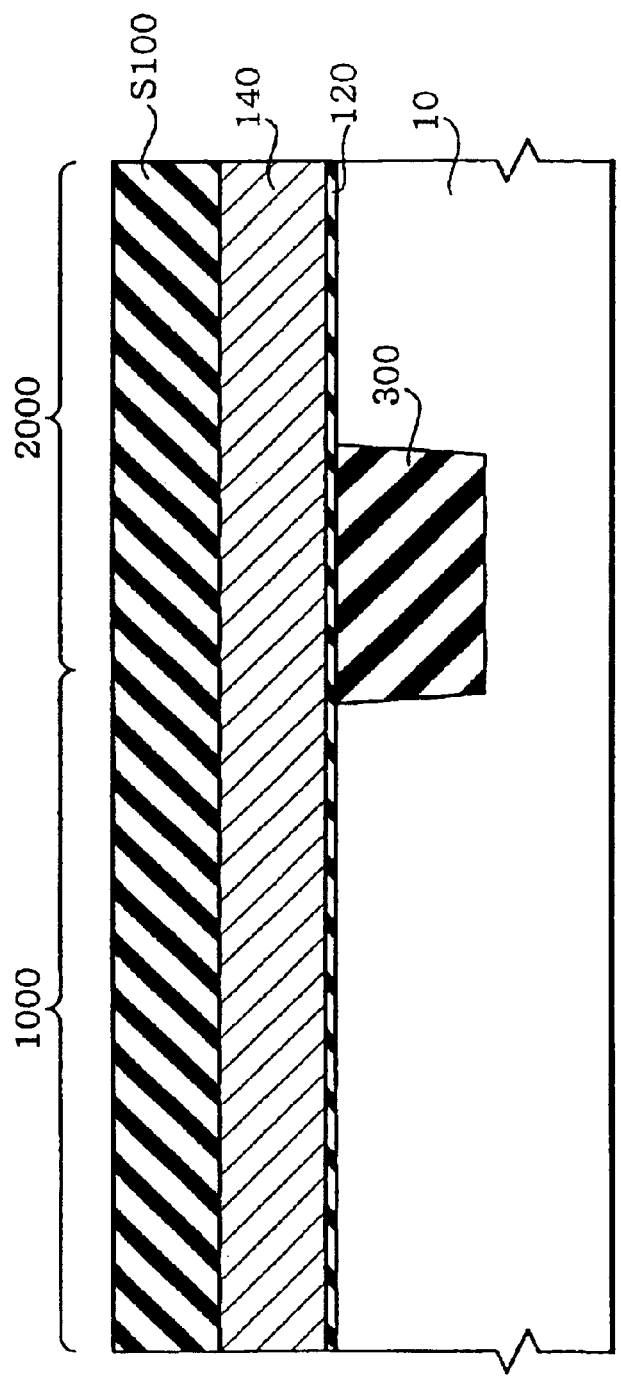
FIG. 4 is a section view showing one step in the method of fabricating a semiconductor device in accordance with the embodiment of the present invention.

(1) First of all, the element isolation region 300 is formed by a trench isolation method in the surface of the semiconductor substrate 10, as shown in FIG. 4.

A dielectric layer 120 that will become the gate dielectric layer is then formed on the surface of the semiconductor substrate 10. A gate layer (first conductive layer) 140 that will form the word gate 14 and the gate electrode 142 is then deposited on the dielectric layer 120. The gate layer 140 is formed from doped polysilicon. In a subsequent CMP step, a stopper layer S100 is then formed on the gate layer 140. The stopper layer S100 is formed from a silicon nitride layer.

Figure 5:
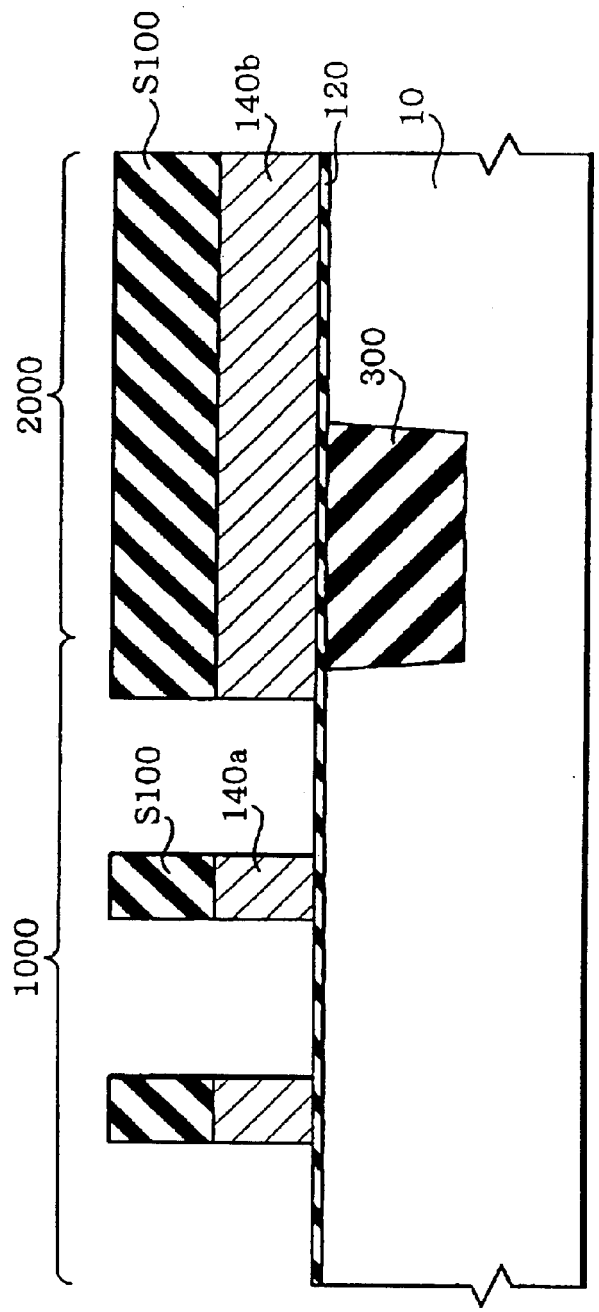
FIG. 5 is a section view showing one step in the method of fabricating a semiconductor device in accordance with the embodiment of the present invention.

(2) A resist layer (not shown in the figure) that covers the entire common contact portion 200 and also extends as far as part of the memory region 1000 is then formed. This resist layer is used as a mask for patterning the stopper layer S100. The resist layer is subsequently removed and the patterned stopper layer S100 is used as a mask for etching the gate layer 140. As shown in FIG. 5, the gate layer 140 if patterned over the memory region 1000 to form a gate layer 140a. The gate layer 140 within the logic circuit region 2000 is not patterned during this step (hereinafter, the gate layer 140 within the logic circuit region is denoted by 140b for convenience).

Figure 6:
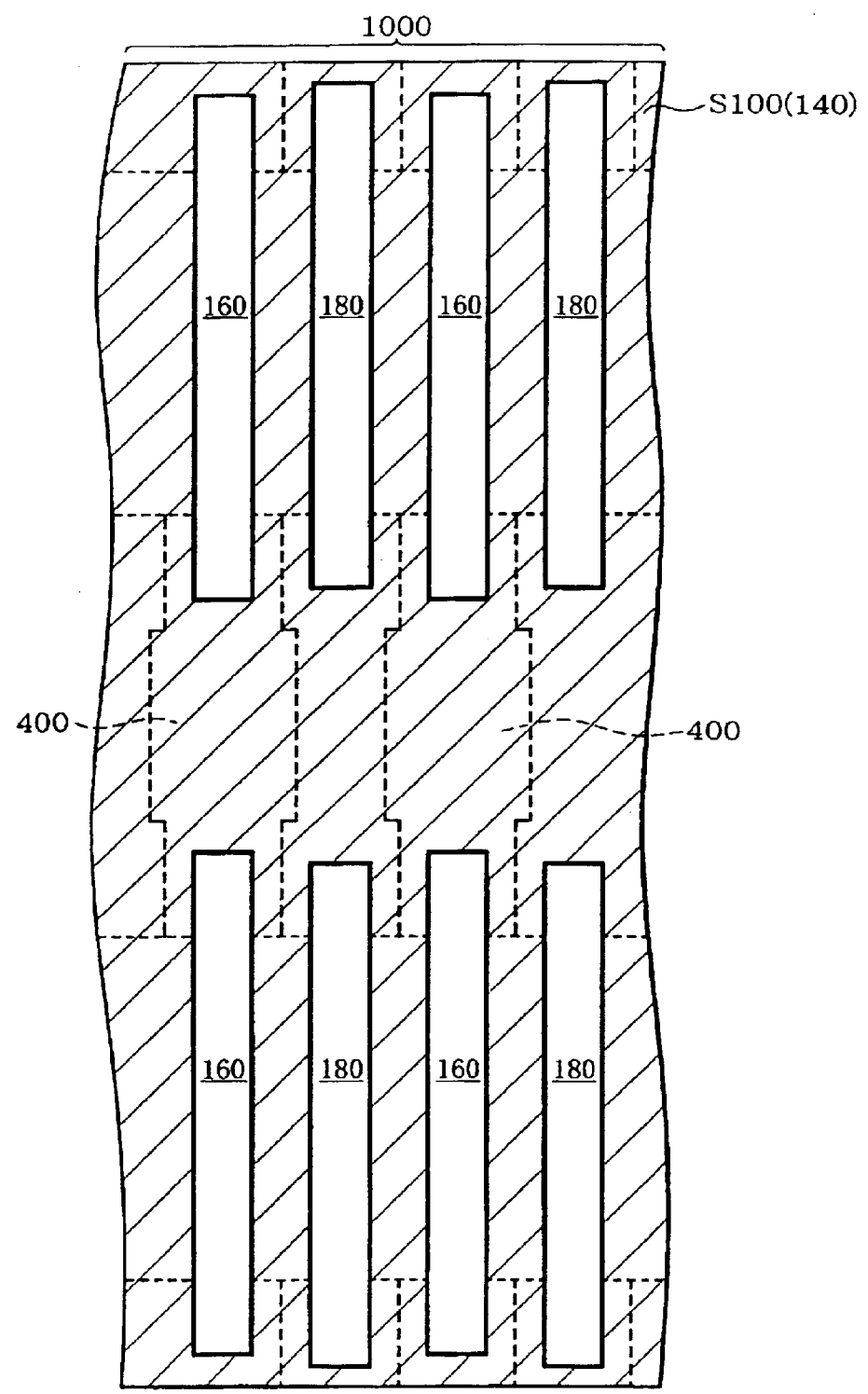
FIG. 6 is a plan view showing one step in the method of fabricating a semiconductor device in accordance with the embodiment of the present invention.

The status after the patterning is shown in plan view in FIG. 6. Aperture portions 160 and 180 are provided by this patterning in a laminate formed by the gate layer 140a and the stopper layer S100 within the memory region 1000. The aperture portions 160 and 180 correspond substantially to regions in which the impurity layers 16 and 18 will be formed by subsequent ion implantation. The side dielectric layers and control gates will also be formed on the side surfaces of the aperture portions 160 and 180 by subsequent processing.

Figure 7:
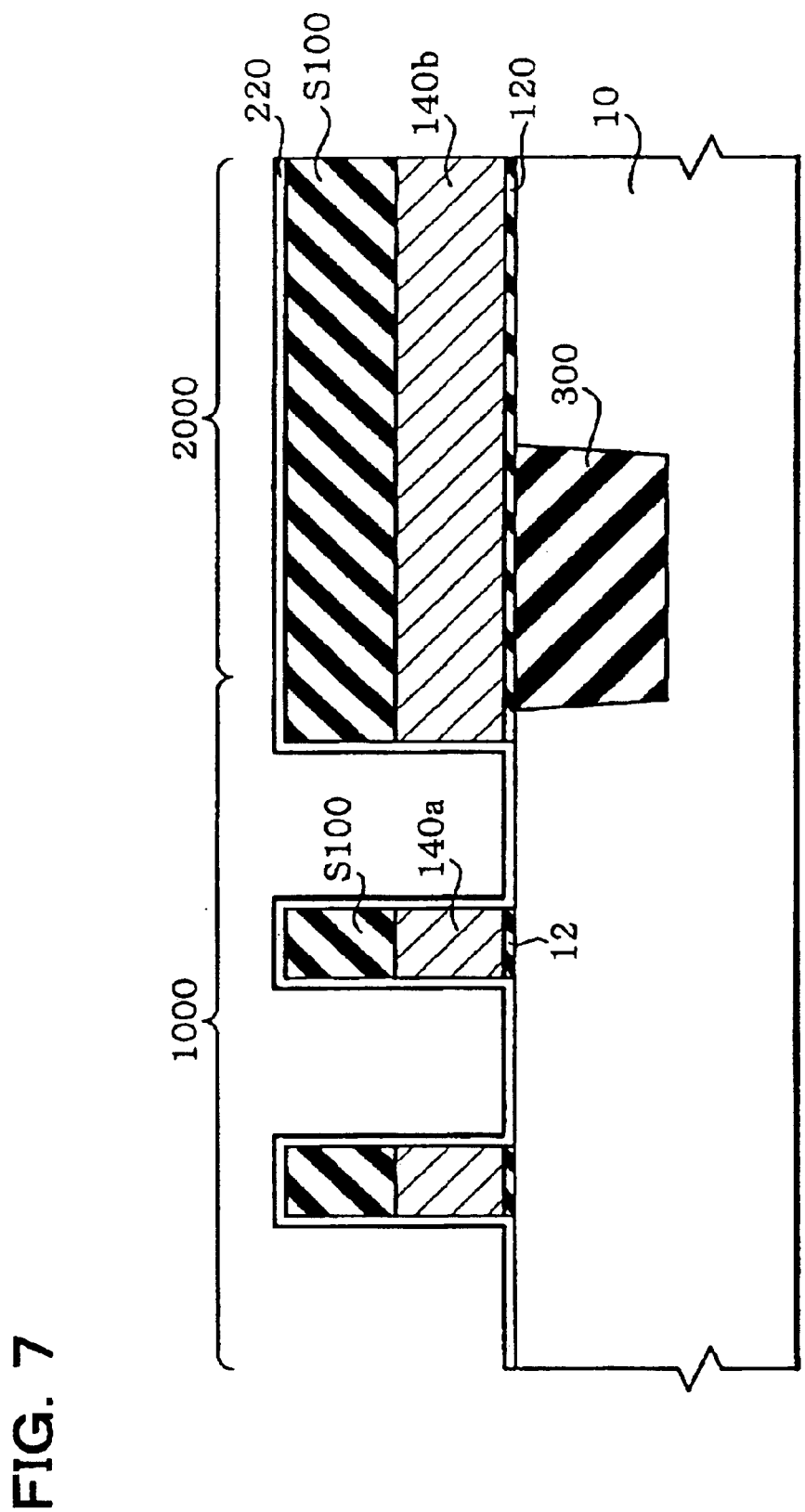
FIG. 7 is a section view showing one step in the method of fabricating a semiconductor device in accordance with the embodiment of the present invention.

(3) An ONO film that is a charge accumulation film is formed over the entire surface of the semiconductor substrate 10, as shown in FIG. 7. The ONO film 220 is formed by sequentially depositing a first silicon oxide layer, a silicon nitride layer, and a second silicon oxide layer. The first silicon oxide layer could be a film formed by a process such as thermal oxidation or CVD, by way of example. The silicon nitride layer could be formed as a film by CVD, by way of example. The second silicon oxide layer could be formed as a film by using CVD, more specifically, by high-temperature oxidation (HTO). It is preferable to perform annealing after these films have been formed, to reduce the size of each layer.

The ONO film 220 becomes the second gate dielectric layer 22 and the side dielectric layer 24, by subsequent patterning (see FIG. 3).

Figure 8:
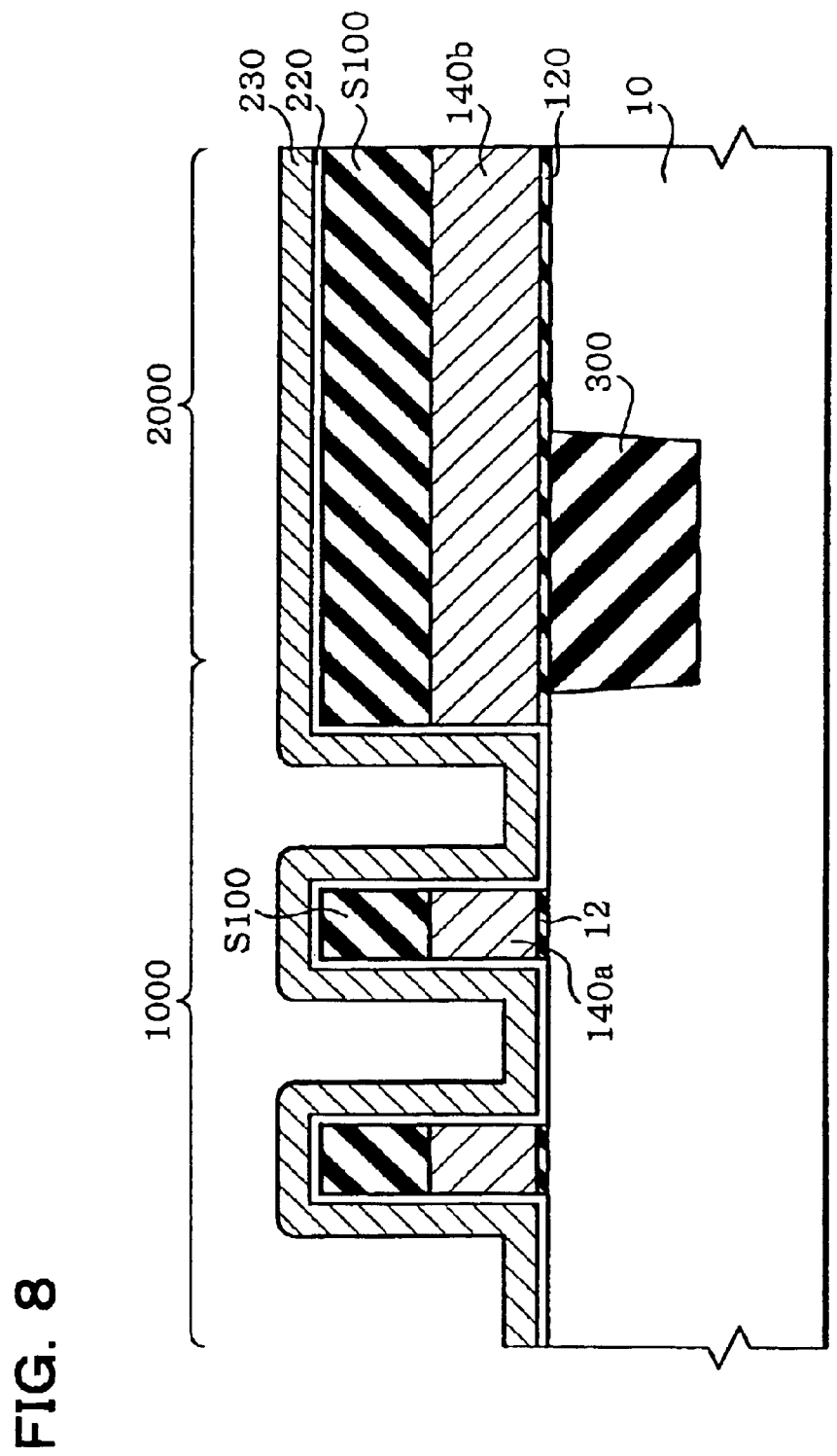
FIG. 8 is a section view showing one step in the method of fabricating a semiconductor device in accordance with the embodiment of the present invention.

(4) As shown in FIG. 8, a doped polysilicon layer (second conductive layer) 230 is formed over the entire surface of the ONO film 220. The doped polysilicon layer 230 will become the conductive layer 40 (see FIG. 1) that forms the first and second control gates 20 and 30, by subsequent etching.

Figure 9:
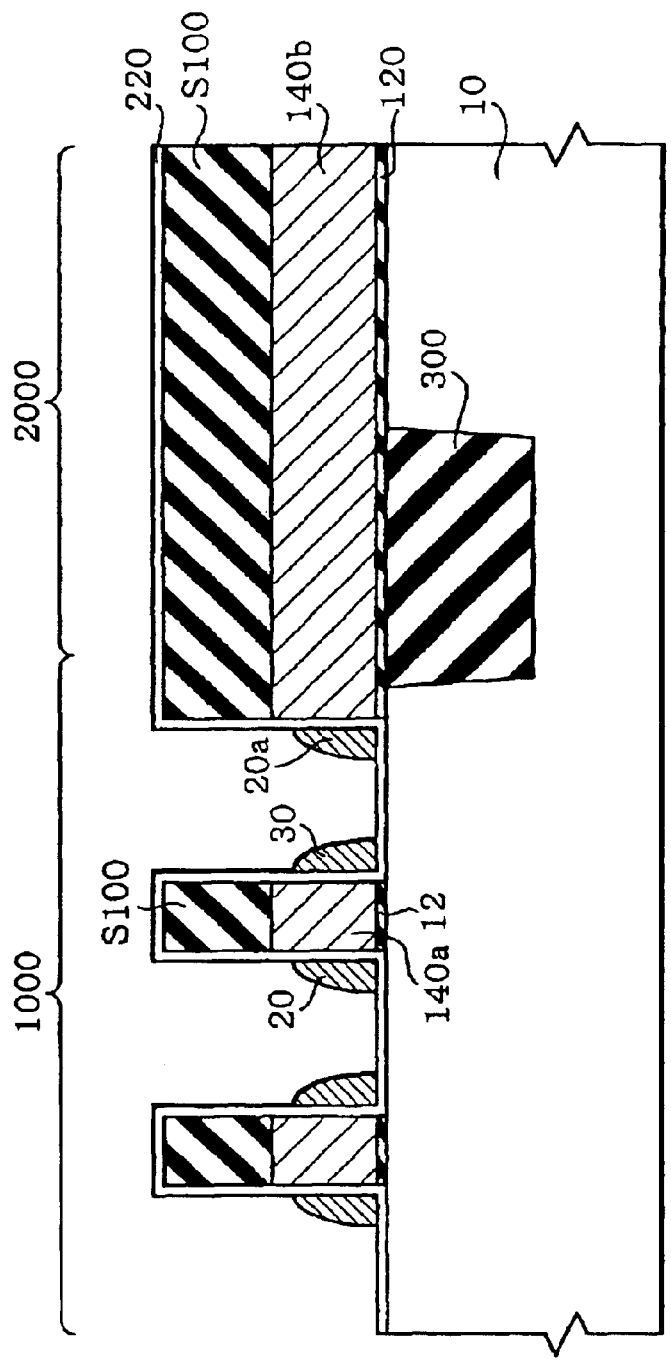
FIG. 9 is a section view showing one step in the method of fabricating a semiconductor device in accordance with the embodiment of the present invention.

(5) As shown in FIG. 9, the first and second control gates 20 and 30 are formed by anisotropic etching over the entire surface of the doped polysilicon layer 230 (see FIG. 8).

In other words, the first and second control gates 20 and 30 are formed in the shape of side walls along the side surfaces of the aperture portions 160 and 180 (see FIG. 6) of the memory region 1000, by this etching step. At the same time, the doped polysilicon layer 230 deposited on the logic circuit region 2000 is completely removed. It should be noted that the doped polysilicon layer 230 on the side surface of an edge portion (on the memory region 1000 side) of the gate layer 140b in the boundary region remains, to form the side-wall-shaped conductive layer 20a.

Figure 10:
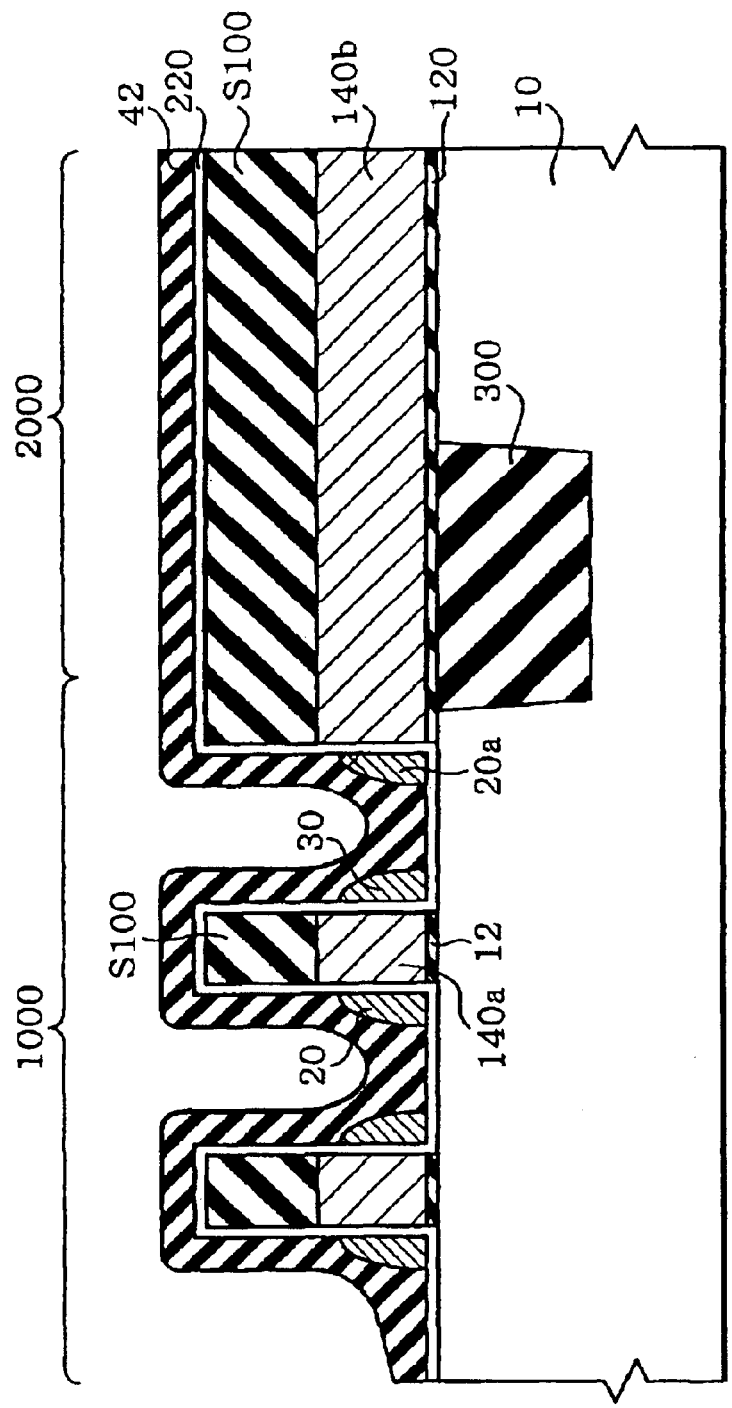
FIG. 10 is a section view showing one step in the method of fabricating a semiconductor device in accordance with the embodiment of the present invention.
Figure 11:
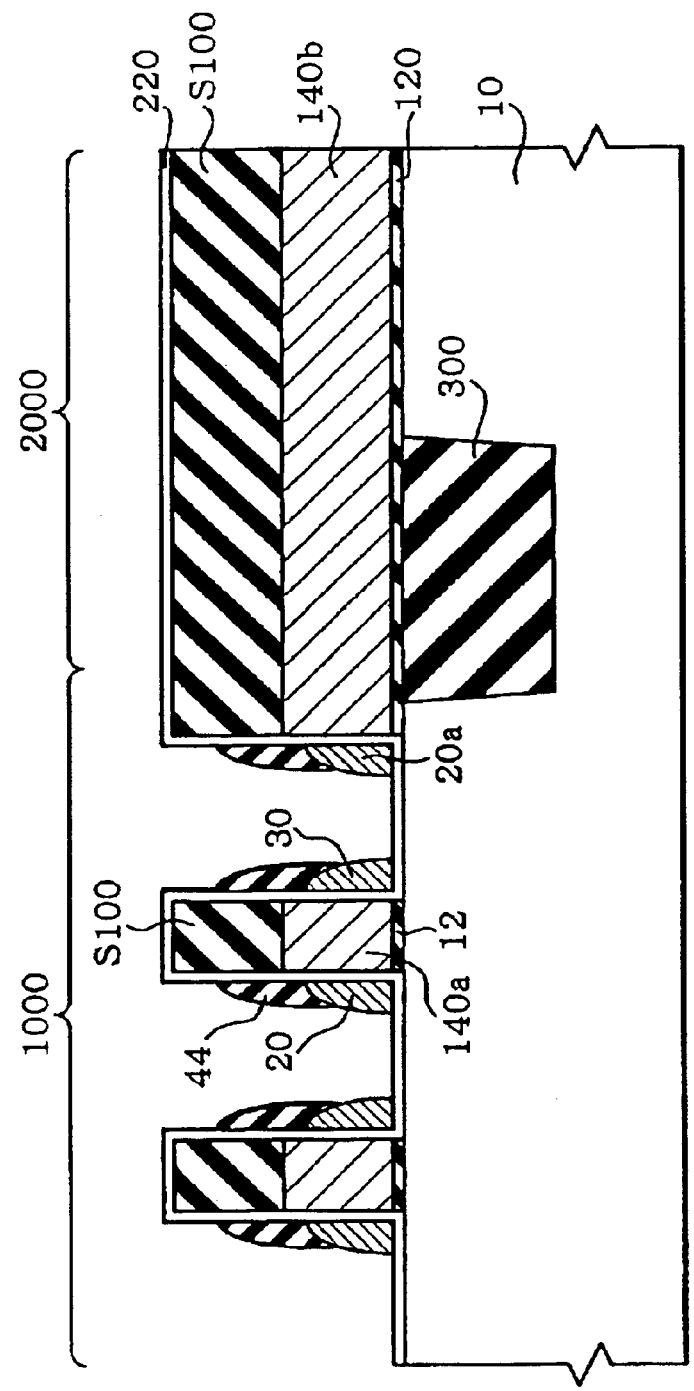
FIG. 11 is a section view showing one step in the method of fabricating a semiconductor device in accordance with the embodiment of the present invention.

(6) As shown in FIG. 10, a dielectric layer 42 of a material such as silicon oxide or silicon nitride is formed over the entire surface. The first side wall dielectric layer 44 is then formed on the side surfaces of a laminate consisting of the gate layer 140a and a stopper layer S100a, by anisotropic etching of the entire surface of the dielectric layer 42, so as to cover at least the upper portions of the first and second control gates 20 and 30. In other words, the first side wall dielectric layer 44 is formed to fulfill the role of minimizing any discontinuities between the side surfaces of the laminates consisting of the gate layer 140a and the stopper layer S100a and the first and second control gates 20 and 30.

Figure 12:
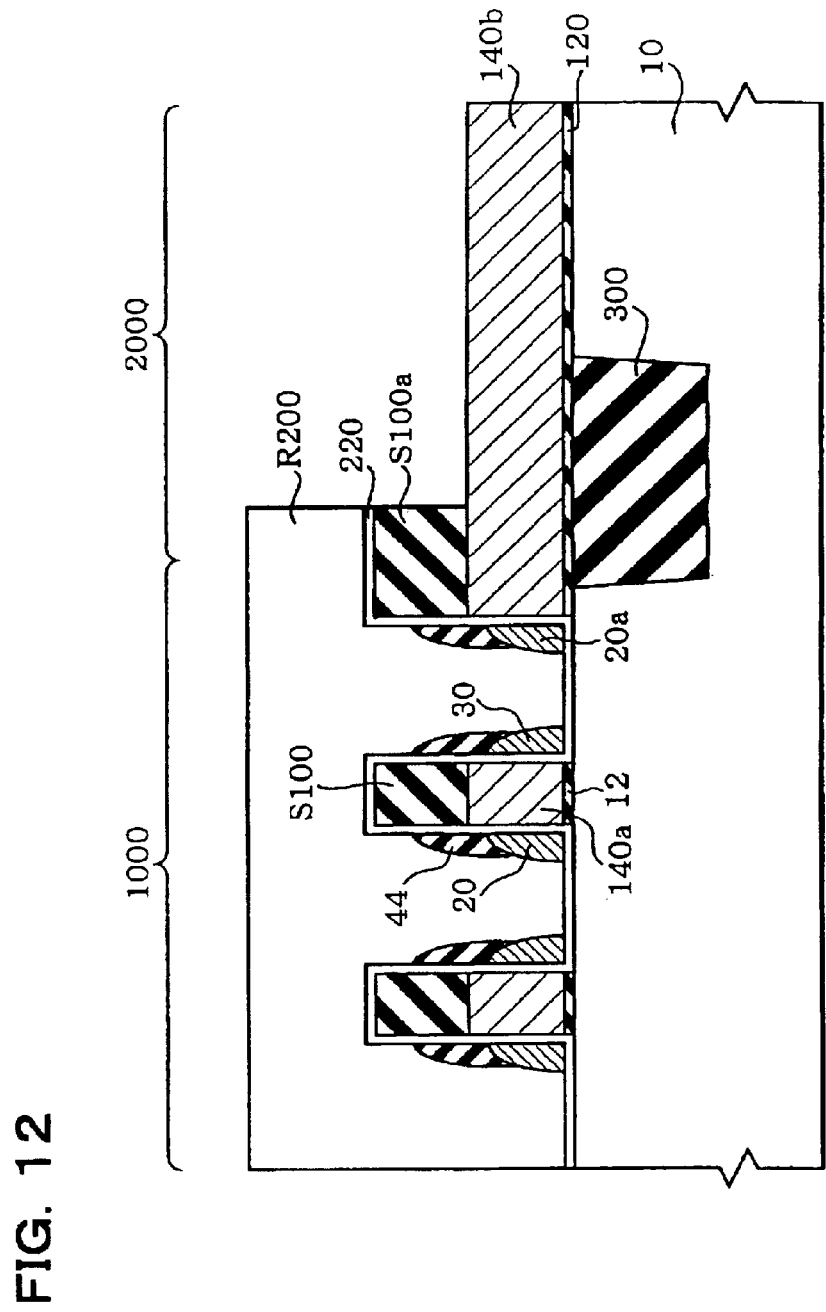
FIG. 12 is a section view showing one step in the method of fabricating a semiconductor device in accordance with the embodiment of the present invention.

(7) As shown in FIG. 12, a resist layer R200 is formed so as to cover the memory region 1000 and also extend as far as part of the logic circuit region. The resist layer R200 is used as a mask to remove the ONO film 220 and the stopper layer S100 in the logic circuit region 2000. The stopper layer S100 within the logic circuit region 2000 is removed by this etching step, except for the boundary region.

At this time, the region covered by both the resist layer used in the above-described etching step (2) and the resist layer R200 used in this etching step (7), which is the gate layer 140b that is positioned in the boundary region between the memory region 1000 and the logic circuit region 2000, becomes the boundary portion 140c (see FIG. 3) for subsequent processing. The stopper layer S100a formed by this patterning is wider than the other stopper layer S100 within the memory region 1000. The resist layer R200 is then removed.

Figure 13:
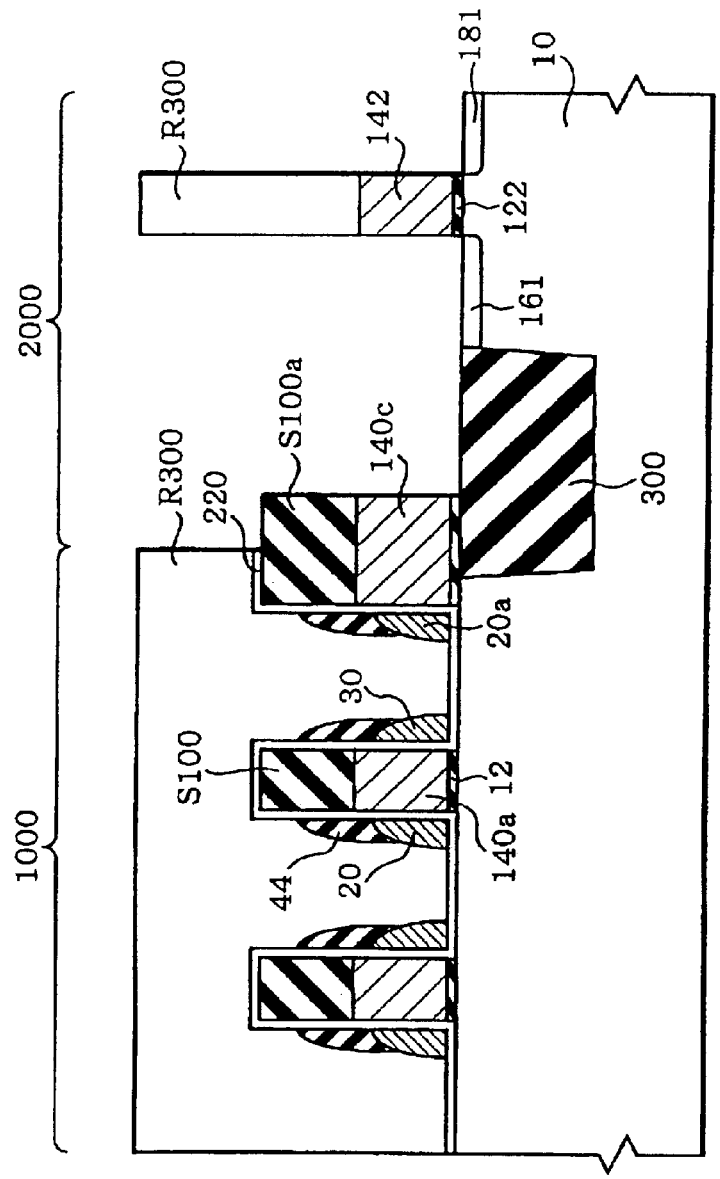
FIG. 13 is a section view showing one step in the method of fabricating a semiconductor device in accordance with the embodiment of the present invention.

(8) As shown in FIG. 13, a resist layer R300 for forming the gate electrode 142 is formed. This resist layer R300 is patterned so as to cover the entire memory region 1000 and a predetermined portion within the logic circuit region 2000. The resist layer R300 is then used as a mask to form the gate electrode 142 within the logic circuit region 2000 by etching of the gate layer 140b (see FIG. 12). The boundary portion 140c is formed in a self-aligned way by this etching, using the resist layer R300 and the stopper layer S100a as a mask.

The resist layer R300 is subsequently removed. Extension layers 161 and 181 of the source region and drain region are then formed by doping an n-type impurity into the logic circuit region 2000. The resist layer R300 is then removed.

Figure 14:
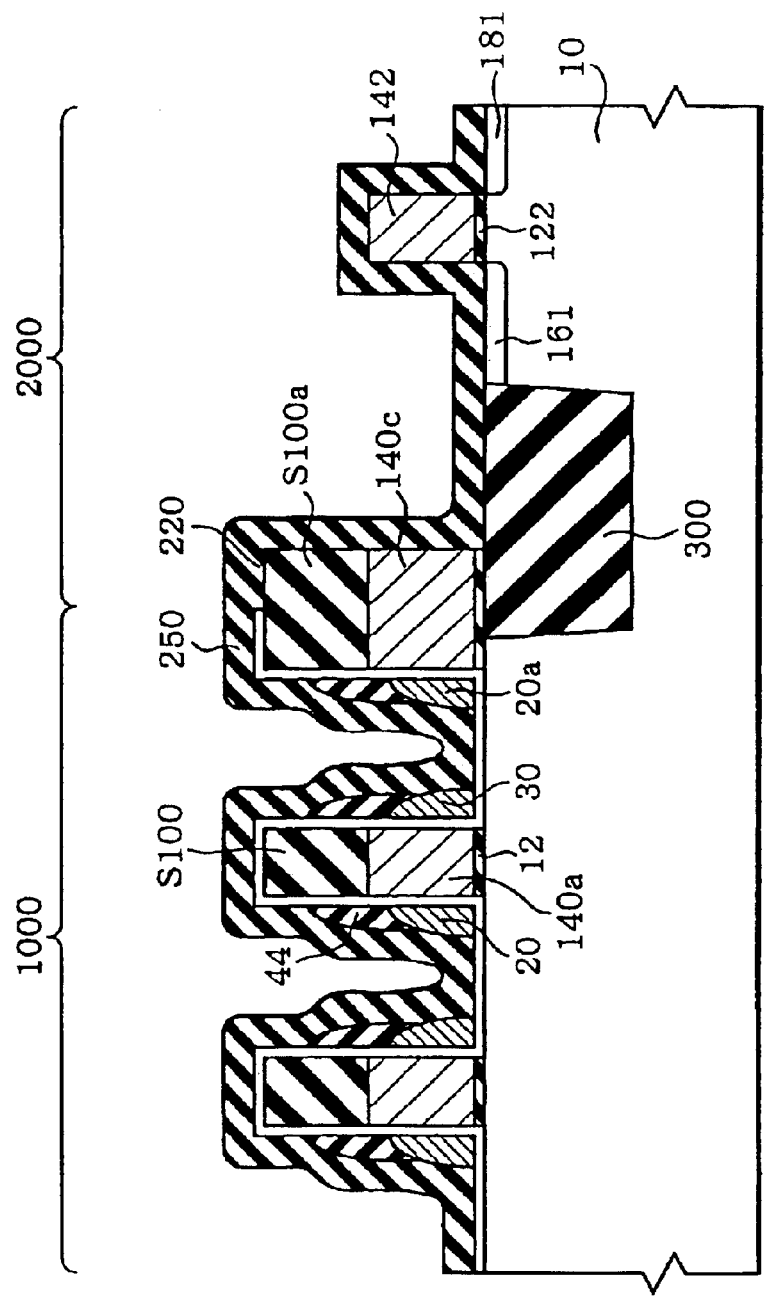
FIG. 14 is a section view showing one step in the method of fabricating a semiconductor device in accordance with the embodiment of the present invention.
Figure 15:
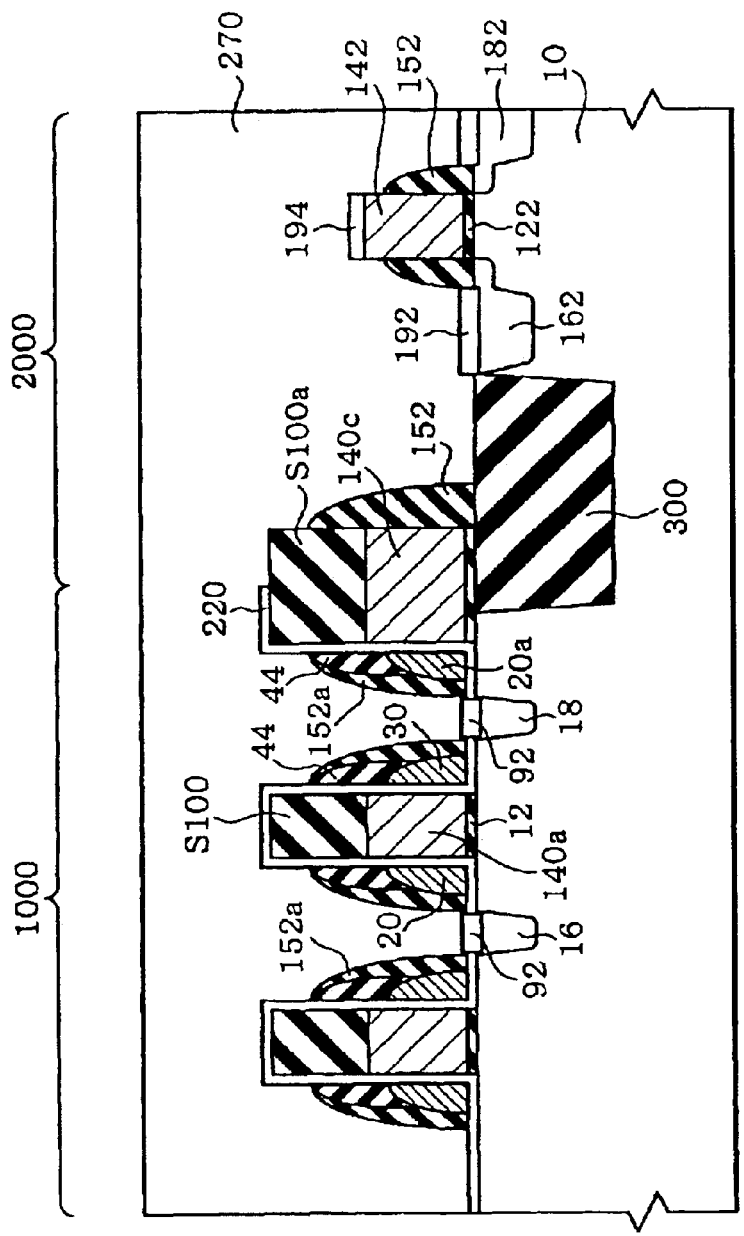
FIG. 15 is a section view showing one step in the method of fabricating a semiconductor device in accordance with the embodiment of the present invention.

(9) As shown in FIG. 14, a dielectric layer 250 is formed of a material such as silicon oxide or silicon nitride oxide over the memory region 1000 and the logic circuit region 2000. As shown in FIG. 15, the side wall dielectric layer 152 is then formed on both side surfaces of the gate electrode 142 in the logic circuit region 2000, by anisotropic etching of the entire surface of the dielectric layer 250 (see FIG. 14). In addition, the side wall dielectric layer 152 is formed on the side surface of the boundary portion 140c on the logic circuit region 2000 side. The second side wall dielectric layer 152a is formed to cover the first and second control gates 20 and 30 and the first side wall dielectric layer 44. In addition, the dielectric layer deposited on the region in which a silicide layer will be formed by subsequent processing is removed by this etching, to expose the semiconductor substrate.

(10) The impurity layers 16 and 18 that will form the source region or drain region of the memory region 1000 and the impurity layers 162 and 182 that will form the source region or drain region of the logic circuit region 2000 are formed by implantation of ions of an n-type impurity.

A metal for the formation of a silicide is then deposited over the entire surface. The metal for the formation of a silicide could be titanium or cobalt, by way of example. The silicide layer 92 is subsequently formed on the upper surfaces of the impurity layers 16 and 18 by a silicide reaction of the metal formed on top of the impurity layers 16, 18, 162, and 182 and the gate electrode 142, the silicide layer 192 is formed on the upper surface of the impurity layers 162 and 182, and the silicide layer 194 is formed on the upper surface of the gate electrode 142. Therefore, this silicide step ensures that the gate electrode and also the source region or drain region of the MOS transistor 500 of the logic circuit region 2000 is silicided in a self-aligning manner. Each memory cell 100 of the memory region 1000 is also silicided by the same silicide step, with the surface of the source region or drain region providing self-alignment.

The dielectric layer 270 is then formed over the memory region 1000 and the logic circuit region 2000, of a material such as silicon oxide or silicon nitride oxide. The dielectric layer 270 is formed to cover the stopper layers S100 and S100a.

Figure 16:
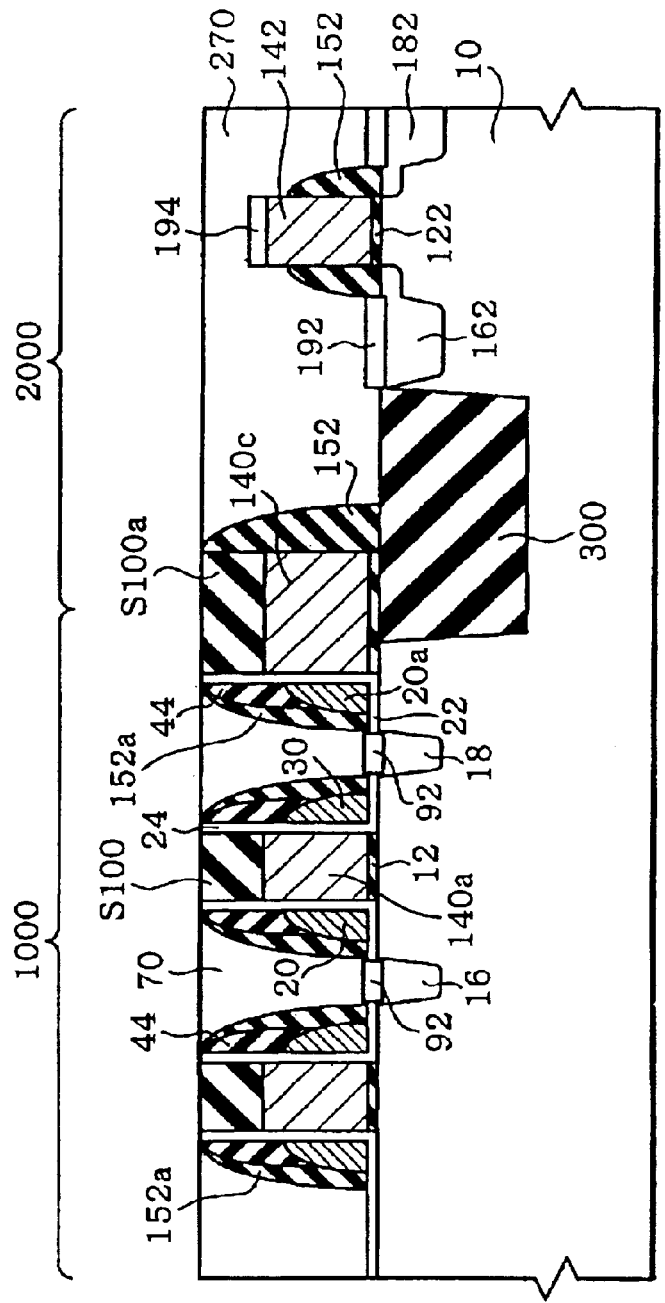
FIG. 16 is a section view showing one step in the method of fabricating a semiconductor device in accordance with the embodiment of the present invention.

(11) As shown in FIG. 16, a CMP method is used to polish the dielectric layer 270 until the stopper layers S100 and S100a are exposed, to flatten the dielectric layer 270. This polishing leaves the dielectric layer 270 between the two opposing side dielectric layers 24 that sandwich the first and second control gates 20 and 30, to form the embedded dielectric layer 70.

At this time, the upper edges of the side dielectric layers 24 formed on the side surfaces of the gate layer 140a and the stopper layer S100 in the memory region 1000 are positioned higher above the semiconductor substrate 10 than the upper edges of the first and second control gates 20 and 30. The MOS transistor 500 in the logic circuit region 2000 is completely covered by the dielectric layer 270.

At the stage at which this polishing step has ended, therefore, each of the stopper layers S100 and S100a remains above the gate layer 140a and the boundary portion 140c that will form the word gate 14. There is no stopper layer above the gate electrode 142, on the other hand, and the dielectric layer 270 remains there.

(12) The stopper layers S100 and S100a (see FIG. 16) are removed by hot phosphoric acid. As a result, at least the upper surfaces of the gate layer 140a and the boundary portion 140c are exposed. A doped polysilicon layer (not shown in the figures) is subsequently deposited over the entire surface.

Figure 17:
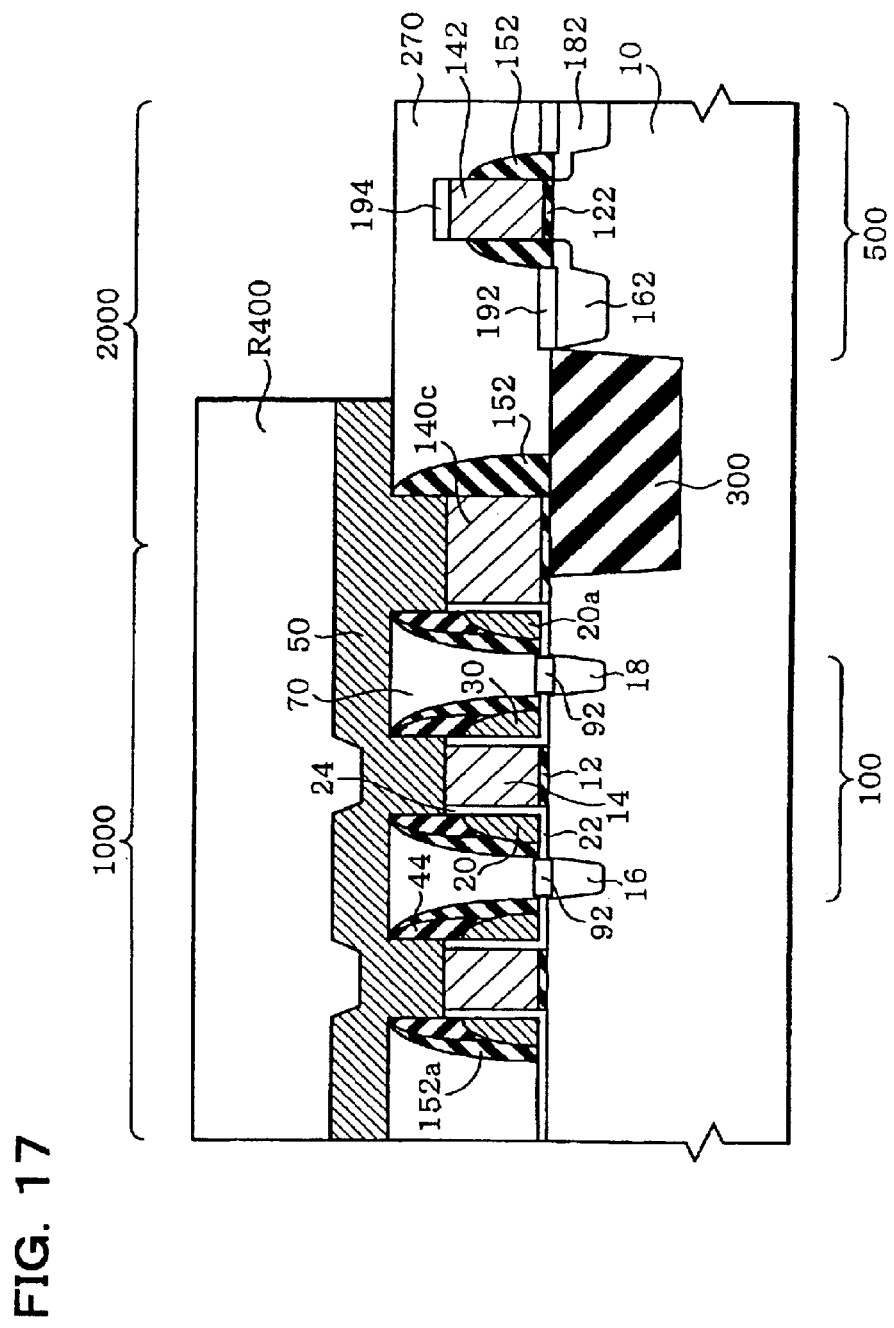
FIG. 17 is a section view showing one step in the method of fabricating a semiconductor device in accordance with the embodiment of the present invention.
Figure 18:
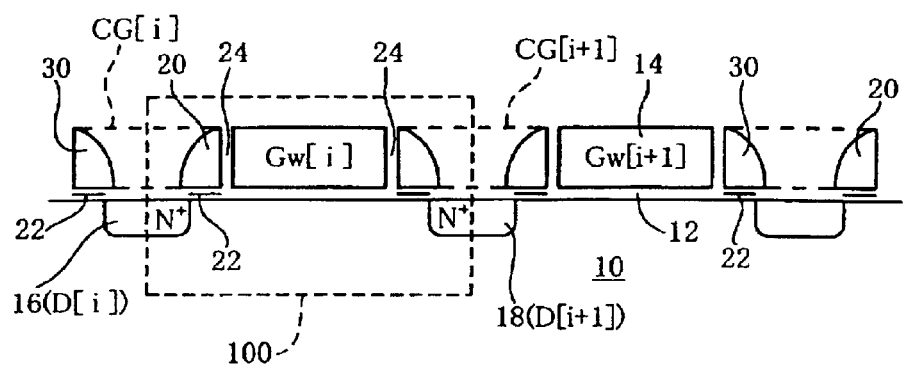
FIG. 18 is a section view showing a conventional MONOS type of memory cell.

Patterning is done on the doped polysilicon layer to form a resist layer R400, as shown in FIG. 17. The word line 50 is formed by patterning the doped polysilicon layer, using the resist layer R400 as a mask.

After that the resist layer R400 is used as a mask for etching the gate layer 140a (see FIG. 14). This etching removes the gate layer 140a that is not formed over the word line 50. As a result, it is possible to form the word gates 14 that are arranged in an array. The removed portions of the gate layer 140a correspond to the regions for the p-type impurity layer (impurity layer for element separation) 15 that will be formed later (see FIG. 2).

In this etching step, the conductive layer 40 that will form the first and second control gates 20 and 30 is covered by the embedded dielectric layer 70, so it is not etched and it remains intact. In addition, since the MOS transistor 500 of the logic circuit region 2000 is completely covered by the dielectric layer 270, this etching has no effect thereon.

A p-type impurity is then doped into the entire surface of the semiconductor substrate 10. This forms a p-type impurity layer (impurity layer for element separation) 15 (see FIG. 2) in each region between the word gates 14 in the Y direction. This p-type impurity layer 15 ensures more reliable element separation between adjacent non-volatile semiconductor storage devices 100.

The above described steps enable the fabrication of the semiconductor device shown in FIGS. 1, 2, and 3.

The advantages of the fabrication method of this embodiment are discussed below.

In the step (6), the first side wall dielectric layer 44 is formed to cover the upper portions of the first and second control gates 20 and 30 on the side surfaces of stack formed by the gate layer 140a and the stopper layer S100. This makes it possible to minimize discontinuities in the surfaces formed by the second side wall dielectric layer 152a and thus form the second side wall dielectric layer 152a in an optimal manner. In other words, it makes it possible to form a dielectric layer that completely covers the first and second control gates 20 and 30 with the first side wall dielectric layer 44 and the second side wall dielectric layer 152a. If the side wall dielectric layers are not formed satisfactorily on the side surfaces of the first and second control gates 20 and 30, it could happen that the silicide will form on the surfaces of the control gates. In such a case, a problem of short-circuiting between the control gates and the bit line 60 formed by the impurity layer 16 could occur, but the present invention makes it possible to prevent such a problem.

Although an embodiment of the present invention was discussed above, it should be obvious to those skilled in the art that the present invention is not limited thereto and thus different variations are possible within the scope of the present invention. For example, a semiconductor substrate in bulk form was used as the semiconductor layer in the above described embodiment, but it is equally possible to use a semiconductor layer of a SOI substrate.

What is claimed is:

1. A method of fabricating a semiconductor device that comprises a memory region including a non-volatile storage device and a logic circuit region including a peripheral circuit for the non-volatile storage device, the method comprising steps of:

(a) forming a first dielectric layer over a semiconductor layer, (b) forming a first conductive layer over the first dielectric layer, (c) forming a stopper layer over the first conductive layer, (d) patterning the stopper layer and the first conductive layer within the memory region, (e) forming a charge accumulation film over the memory region and the logic circuit region, (f) forming a second conductive layer over the charge accumulation film, then forming control gates in the form of side walls over both side surfaces of the first conductive layer within at least the memory region with the charge accumulation film interposed in between, by anisotropic etching of the second conductive layer, (g) forming first side wall dielectric layers on at least upper portions of the control gates and over both side surfaces of a laminate formed of the stopper layer and the first conductive layer, (h) removing the stopper layer from within the logic circuit region, (i) patterning the first conductive layer within the logic circuit region, to form a gate electrode of an insulated-gate field-effect transistor within the logic circuit region, (j) forming side wall dielectric layers on both side surfaces of the gate electrode, and also forming a second side wall dielectric layer so as to cover each of the first side wall dielectric layers and each of the control gates, (k) forming first impurity layers, each of which becomes a source region or a drain region of the non-volatile storage device and forming second impurity layers, each of which becomes a source region or a drain region of the insulated-gate field-effect transistor, (l) forming silicide layers on the surfaces of the first impurity layers and the second impurity layers, (m) forming a second dielectric layer over the memory region and the logic circuit region, (n) removing the second dielectric layer in such a manner that the stopper layer is exposed within the memory region and also the gate electrode is not exposed within the logic circuit region, (o) removing the stopper layer from within the memory region, and (p) patterning the first conductive layer within the memory region, to form a word gate for the non-volatile storage device within the memory region.

2. The method of fabricating a semiconductor device as defined by claim 1, wherein:

the step (l) comprises forming a silicide layer on the surface of the gate electrode.

3. The method of fabricating a semiconductor device as defined by claim 1, wherein:

in the step (n), the second dielectric layer is removed by polishing.

4. The method of fabricating a semiconductor device as defined by claim 1, wherein:

an ONO film is used as the charge accumulation film.

* * * * *